(12) United States Patent
Ro et al.

(10) Patent No.: US 10,051,195 B2
(45) Date of Patent: Aug. 14, 2018

(54) APPARATUS AND METHOD FOR ACQUIRING DIFFERENTIAL IMAGE

(71) Applicant: Hyundai Motor Company, Seoul (KR)

(72) Inventors: Hee Jin Ro, Seoul (KR); Seok Beom Lee, Seoul (KR); Dong Hee Seok, Seoul (KR); Sung Min Park, Seoul (KR)

(73) Assignee: Hyundai Motor Company, Seoul (KR)

( * ) Notice: Subject to any disclaimer, the term of this patent is extended or adjusted under 35 U.S.C. 154(b) by 708 days.

(21) Appl. No.: 14/066,235

(22) Filed: Oct. 29, 2013

(65) Prior Publication Data

US 2014/0146181 A1 May 29, 2014

(30) Foreign Application Priority Data

Nov. 29, 2012 (KR) .......................... 10-2012-0136876

(51) Int. Cl.
| | |
|---|---|
| *H04N 5/33* | (2006.01) |
| *H04N 5/225* | (2006.01) |
| *H04N 5/235* | (2006.01) |
| *G06K 9/20* | (2006.01) |
| *G02B 27/01* | (2006.01) |
| *H01L 27/146* | (2006.01) |

(52) U.S. Cl.
CPC ........... *H04N 5/2354* (2013.01); *H04N 5/332* (2013.01); *G02B 2027/0138* (2013.01); *G06K 9/209* (2013.01); *G06K 9/2018* (2013.01); *H01L 27/146* (2013.01); *H01L 27/14607* (2013.01); *H01L 27/14647* (2013.01); *H01L 27/14652* (2013.01); *H04N 5/2254* (2013.01)

(58) Field of Classification Search
None
See application file for complete search history.

(56) References Cited

U.S. PATENT DOCUMENTS

| 7,720,264 B2 * | 5/2010 | Fouquet .................... G01J 3/26 382/103 |
| 7,835,633 B2 * | 11/2010 | Omi .................... G06K 9/00255 348/78 |
| 2005/0170304 A1 * | 8/2005 | Chung .................... F23Q 2/161 431/153 |

(Continued)

FOREIGN PATENT DOCUMENTS

| JP | 2009-300386 A | 12/2009 |
| KR | 10-2004-0083658 A | 10/2004 |

(Continued)

*Primary Examiner* — Joseph Ustaris
*Assistant Examiner* — William Adrovel
(74) *Attorney, Agent, or Firm* — McDermott Will & Emery LLP

(57) ABSTRACT

An apparatus for acquiring a differential image includes: an image acquiring unit acquiring a first image including environment light from an image sensor of a camera and infrared polarized light from an illuminating unit and a second image including horizontal polarized light of the environment light; an image correcting unit correcting brightnesses of background areas of the first and second images; and a differential image generating unit generating a differential image between the first and second images of which the brightnesses of the background areas are corrected.

9 Claims, 5 Drawing Sheets

(56) References Cited

U.S. PATENT DOCUMENTS

| | | | |
|---|---|---|---|
| 2005/0185243 A1* | 8/2005 | Wenstrand | A61B 5/18 359/229 |
| 2006/0088193 A1* | 4/2006 | Muller | G06K 9/00597 382/117 |
| 2006/0104488 A1* | 5/2006 | Bazakos | G06K 9/00255 382/118 |
| 2007/0076958 A1* | 4/2007 | Venkatesh | G06K 9/00604 382/218 |
| 2010/0289885 A1* | 11/2010 | Lu | H04N 5/2258 348/61 |
| 2011/0317048 A1* | 12/2011 | Bai | H01L 27/1461 348/294 |
| 2012/0134547 A1 | 5/2012 | Jung | |
| 2013/0063641 A1* | 3/2013 | Venezia | H01L 27/14627 348/308 |

FOREIGN PATENT DOCUMENTS

| | | |
|---|---|---|
| KR | 10-2006-0066807 A | 6/2006 |
| KR | 10-0649384 B1 | 11/2006 |
| KR | 10-2010-0121173 A | 11/2010 |
| KR | 10-2012-0039354 A | 4/2012 |
| KR | 10-2012-0057446 A | 6/2012 |

\* cited by examiner

APPARATUS AND METHOD FOR ACQUIRING DIFFERENTIAL IMAGE

CROSS-REFERENCE TO RELATED APPLICATION

This application claims benefit of priority to Korean Patent Application No. 10-2012-0136876, filed on Nov. 29, 2012 in the Korean Intellectual Property Office, the disclosure of which is incorporated herein in its entirety by reference.

TECHNICAL FIELD

The present disclosure relates to an apparatus and method for acquiring a differential image, and more particularly, to a technology of applying a differential image between two images, which is acquired by a dual layer sensor of a camera, to a driver monitoring system.

BACKGROUND

A driver monitoring system monitors distraction, drowsiness, and the like, of a driver while driving a vehicle to judge a factor impeding driving in advance and warn the driver of the factor impeding driving in case that the driver does an action other than the driving. This has a significant effect on preventing a traffic accident due to drowsy driving, or the like.

The driver monitoring system generally employs a technology of judging a face and a line-of-sight of the driver using a camera.

However, since an image processing technology using the camera is significantly affected by a surrounding illumination environment, a detection rate significantly changes according to day, night, weather, a position of sun, or the like.

Recently, a technology of increasing a detection rate of an image processing scheme through an illumination control has been introduced. However, since this technology acquires and uses two frames from a camera image, it is vulnerable to noise due to a time difference between the frames. Therefore, a need exists for a method for increasing a detection rate of a driver from one image.

SUMMARY

Accordingly, the present inventive concept has been made to solve the above-mentioned problems occurring in the prior art while maintaining advantages achieved by the prior art intact.

One aspect of the present disclosure provides an apparatus and a method for acquiring a differential image capable of generating a corrected differential image by implementing an image sensor of a camera in a double structure to acquire two images from one image.

Another aspect of the present disclosure encompasses an apparatus and a method for acquiring a differential image capable of acquiring two images having different brightnesses at the same point in time by adjusting light of a photographed image using a polarizing illuminating unit and a polarizing filter.

Still another aspect of the present disclosure provides an apparatus and a method for acquiring a differential image capable of providing a differential image in which a driver image is clearly discernable to a driver monitoring system by correcting brightnesses of background images of two images having different brightnesses so as to be same as each other and then generating the differential image.

Another aspect of the present disclosure provides an apparatus for acquiring a differential image, including: an image acquiring unit acquiring a first image including environment light from an image sensor of a camera and infrared polarized light from an illuminating unit and a second image including horizontal polarized light of the environment light; an image correcting unit correcting brightnesses of background areas of the first and second images; and a differential image generating unit generating a differential image between the first and second images of which the brightnesses of the background areas are corrected.

The image sensor may include: a first layer sensor primarily sensing the environment light and the infrared polarized light; and a second layer sensor disposed to face the first layer sensor to secondarily sense the environment light in a direction perpendicular to a direction of the infrared polarized light in the environment light and the infrared polarized light passing through the first layer sensor.

The image sensor may further include a polarizing filter disposed between the first and second layer sensors and blocking polarized light in the same direction as that of the infrared polarized light.

The image sensor may synchronize with the illuminating unit.

The image correcting unit may correct the background areas of the first and second images so as to have the same brightness.

The differential image generating unit may remove the environment light component from the differential image between the first and second images of which the brightnesses of the background areas are corrected.

Another aspect of the present disclosure provides a method for acquiring a differential image, including: acquiring a first image including environment light from an image sensor of a camera and infrared polarized light from an illuminating unit and a second image including horizontal polarized light of the environment light; correcting brightnesses of background areas of the first and second images; and generating a differential image between the first and second images of which the brightnesses of the background areas are corrected.

The first image may include the environment light and the infrared polarized light, and the second image may include environment light in a direction perpendicular to a direction of the infrared polarized light in the environment light and the infrared polarized light.

In the step of correcting, the background areas of the first and second images may be corrected so as to have the same brightness.

In the step of generating of the differential image, the environment light component may be removed from the differential image between the first and second images of which the brightnesses of the background areas are corrected.

BRIEF DESCRIPTION OF THE DRAWINGS

The above and other objects, features and advantages of the present disclosure will be more apparent from the following detailed description taken in conjunction with the accompanying drawings, in which:

FIGS. 4A to 5 are reference diagrams for describing an operation of acquiring a differential image in the apparatus for acquiring a differential image according to the exemplary embodiment of the present disclosure.

DETAILED DESCRIPTION

Hereinafter, exemplary embodiments of the present disclosure will be described with reference to the accompanying drawings.

Figure 1:
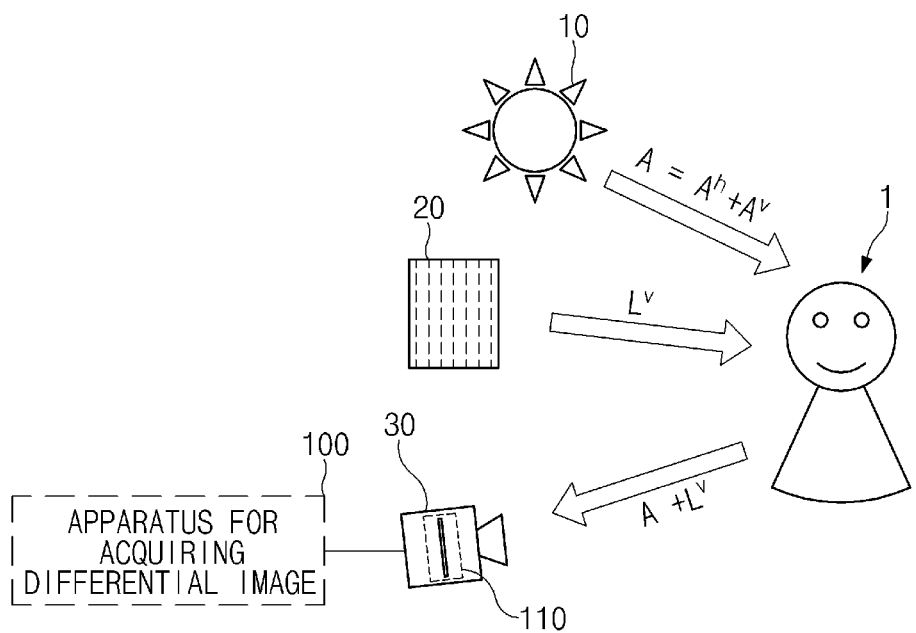
FIG. 1 is a reference diagram for describing an image photographing structure of an apparatus for acquiring a differential image according to an exemplary embodiment of the present disclosure.

FIG. 1 is a reference diagram for describing an image photographing structure of an apparatus for acquiring a differential image according to an exemplary embodiment of the present disclosure. Referring to FIG. 1, in order to acquire a differential image, the apparatus 100 for acquiring a differential image according to the exemplary embodiment of the present disclosure may photograph an object, for example, a driver 1 using a camera 30 in a state in which environment light A from an environment light source 10 and infrared polarized light Lv from an infrared polarizing illuminating unit 20 are illuminated to the driver 1.

Here, the environment light A may correspond to natural light such as sunlight that may be generated in the surrounding area. Here, the environment light A includes polarized light in all directions, that is, a horizontal polarized light Ah component and a vertical polarized light Av component. Meanwhile, the infrared polarized light may correspond to polarized light in any one direction, that is, any one of horizontal polarized light Lh and vertical polarized light Lv. Therefore, the exemplary embodiment of the present disclosure will be described on the assumption that the infrared polarized light is the vertical polarized light Lv.

Here, the infrared polarizing illuminating unit 20 may be mounted at an outer portion of the camera 30 or be connected to the camera 30 through a cable, or the like. In addition, during a period in which the driver 1 is photographed by the camera 30, the infrared polarizing illuminating unit 20 may continuously illuminate the driver 1 with the infrared polarized light Lv or instantaneously illuminate the driver 1 with the infrared polarized light Lv only in the case in which the infrared polarizing illuminating unit 20 synchronizes with the camera 30, such that a shutter of the camera 30 operates.

The camera 30 receives the environment light A illuminated to the driver 1 and light A+Lv generated due to reflection of the infrared polarized light Lv from driver 1 to photograph an image of the driver 1. The apparatus 100 for acquiring a differential image may acquire a differential image using the image photographed by the camera 30. Here, the apparatus 100 for acquiring a differential image may be implemented in a software type module in the camera 30 or be implemented as a separate module apparatus, and be connected to the camera 30 through an external interface.

Figure 2:
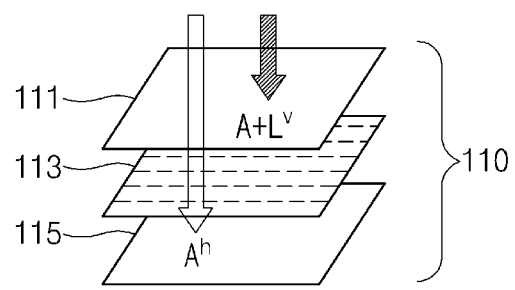
FIG. 2 is a reference diagram for describing a layer sensor structure of an apparatus for acquiring a differential image according to the exemplary embodiment of the present disclosure.

FIG. 2 is a reference diagram illustrating a layer sensor structure of an apparatus for acquiring a differential image according to the exemplary embodiment of the present disclosure. Referring to FIG. 2, an image sensor unit 110 of the camera has a double layer sensor structure. Here, the image sensor unit 110 includes a first layer sensor 111, a second layer sensor 115, and a vertical polarizing filter 113 that is disposed between the first and second layer sensors 111 and 115 and removes the polarized light Av and Lv having the same direction as that of the infrared polarized light Lv.

Therefore, the first layer sensor 111 primarily senses light incident thereto through a camera lens to acquire a first image, and the second layer sensor 115 secondarily senses light passing through the polarizing filter 113 to acquire a second image. In this case, the first image acquired by the first layer sensor 111 is an image including the environment light A and the infrared polarized light Lv, and the second image acquired by the second layer sensor 115 is an image including the horizontal polarized light Ah of the environment light.

The apparatus for acquiring a differential image according to the exemplary embodiment of the present disclosure generates a differential image using the first and second images acquired by the first and second layer sensors 111 and 115, respectively. Therefore, a configuration of the apparatus for acquiring a differential image will be described in more detail with reference to FIG. 3.

Figure 3:
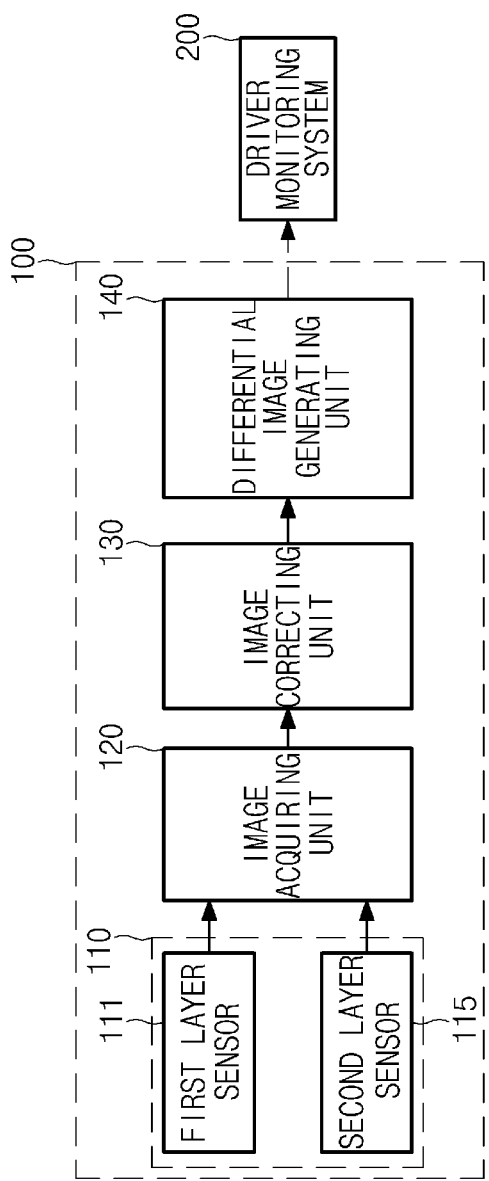
FIG. 3 is a reference block diagram for describing a configuration of the apparatus for acquiring a differential image according to the exemplary embodiment of the present disclosure.

FIG. 3 is a reference block diagram for describing a configuration of the apparatus for acquiring a differential image according to the exemplary embodiment of the present disclosure. Referring to FIG. 3, the apparatus 100 for acquiring a differential image according to the exemplary embodiment of the present disclosure includes an image sensing unit 110, an image acquiring unit 120, an image correcting unit 130, and a differential image generating unit 140.

First, the image sensing unit 110 includes the first and second layer sensors 111 and 115 shown in FIG. 2. Here, the first layer sensor 111 acquires the first image including the environment light and the infrared polarized light and provides the first image to the image acquiring unit 120. In addition, the second layer sensor 115 acquires the second image including the horizontal polarized light of the environment light and provides the second image to the image acquiring unit 120.

Although in an example of FIG. 3, the image sensing unit 110 is implemented in the apparatus for acquiring a differential image, the image sensing unit 110 may be omitted in another exemplary embodiment of the present disclosure. In this case, the image acquiring unit 120 may acquire the first and second images from the image sensor in the camera and use the first and second images to generate the differential image.

The image acquiring unit 120 acquires the first image from the first layer sensor 111 and acquires the second image from the second layer sensor 115. Here, the image acquiring unit 120 transfers the acquired first and second images to the image correcting unit 130.

The image correcting unit 130 analyzes the first and second images when the first and second images are inputted thereto. In this case, the image correcting unit 130 extracts background areas of the first and second images to adjust brightnesses. Particularly, the image correcting unit 130 corrects the background areas of the first and second images so as to have the same brightness. As an example, the image correcting unit 130 may correct the brightness of the background area of the first image so as to be the same as that of the second image or correct the brightness of the background area of the second image so as to be the same as that of the first image. In this case, any one of the brightnesses may be corrected. However, in the following embodiment, the brightness of the background area of the second image will be described.

The image correcting unit 130 transfers the first image and the second image of which the brightness of the background area is corrected to the differential image generating unit 140.

The differential image generating unit 140 generates a differential image between the first image and the corrected second image inputted from the image correcting unit 130. Here, since the corrected second image is corrected so that the brightness of the background area becomes the same as that of the background area of the first image, the background area is excluded from the differential image, such that only a driver area remains in the differential image.

The differential image generating unit 140 provides the generated differential image to the driver monitoring system 200, such that the driver monitoring system may certainly monitor a state of the driver through the differential image.

Figure 4:
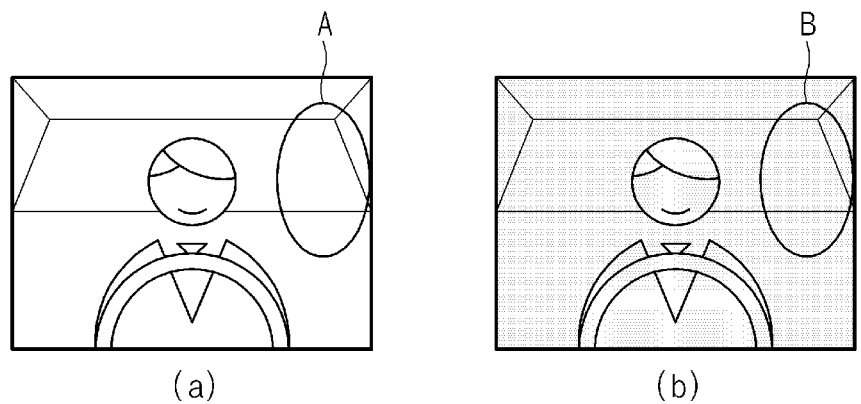

FIGS. 4(*a*), 4(*b*) and 5 are reference diagrams illustrating an operation of acquiring a differential image in the apparatus for acquiring a differential image according to the exemplary embodiment of the present disclosure.

FIG. 4(*a*) shows the first image acquired by the first layer sensor; and FIG. 4(*b*) shows the second image acquired by the second layer sensor.

As shown in FIGS. 4(*a*) and 4(*b*), since the first image includes the environment light and the infrared polarized light, both of the brightnesses of a driver area and a background area in the image are bright. Here, the first image has a high brightness, such that the difference between the driver area and the background area is not clear.

Meanwhile, since the second image includes only the horizontal polarized light of the environment light, the brightness of the driver area and the background area is darker than that of the first image. Therefore, in the second image, the difference between the driver area and the background area is not clear. Since the driver area in the second image is closer to the light source as compared with the background area, it is relatively bright, and since the background area is distant from the light source as compared with the driver area, it is relatively dark.

Therefore, in order to acquire a differential image in which the driver area is clearly discernable, the apparatus 100 for acquiring a differential image perform correction so that the brightness of the background area A of the first image shown in FIG. 4(*a*) and the brightness of the background area B of the second image shown in FIG. 4(*b*) become the same as each other.

Figure 5:
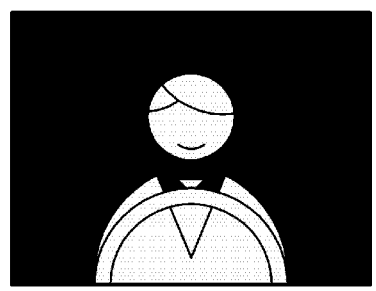

Therefore, a differential image between the first and second images of which the brightnesses of the background areas are corrected is shown in FIG. 5. Here, since the brightnesses of the background areas of the first and second images are the same as each other, a background area of the differential image does not include the environment light and the infrared polarized light, such that it has a black color.

Meanwhile, since the driver area of the first image shown in FIG. 4(*a*) includes the environment light and the infrared polarized light, and the driver area of the second image shown in FIG. 4(*b*) includes the horizontal polarized light of the environment light, a driver area of the differential image shown in FIG. 5 includes the vertical polarized light of the environment light and the infrared polarized light. In this case, the apparatus for acquiring a differential image removes the vertical polarized light of the environment light in the generated differential image, thereby making it possible to acquire a differential image of the driver area including the infrared polarized light from the infrared polarizing illuminating unit.

An operation flow of the apparatus for acquiring a differential image according to the exemplary embodiment of the present disclosure configured as described above will be described below in detail.

Figure 6:
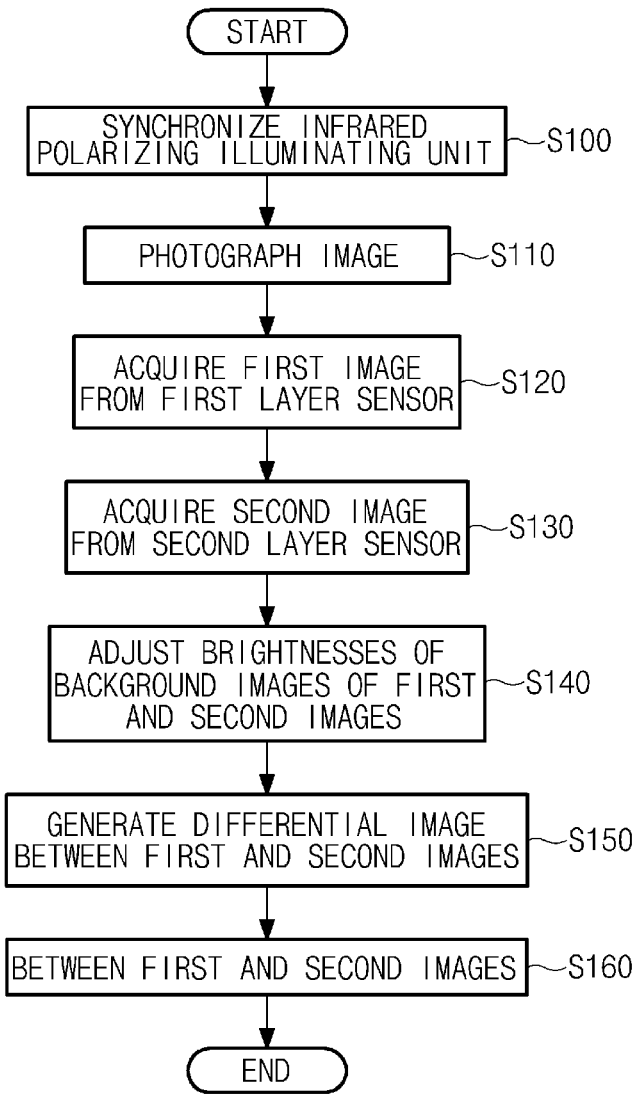
FIG. 6 is a flow chart showing an operation flow of a method for acquiring a differential image according to an exemplary embodiment of the present disclosure.

FIG. 6 is a flow chart showing an operation flow of a method for acquiring a differential image according to an exemplary embodiment of the present disclosure. Referring to FIG. 6, the apparatus for acquiring a differential image synchronizes the infrared (IR) polarizing illuminating unit with the camera (S100) to allow the image to be photographed in a state in which the infrared polarized light from the infrared polarizing illuminating unit is illuminated to the driver (S110).

Here, the camera includes the vertical polarizing filter disposed between the first and second layer sensors in a state in which the first and second layer sensors are disposed to face each other. Then, the apparatus for acquiring a differential image acquires the first image from the first layer sensor of the camera (S120) and acquires the second image from the second layer sensor (S130). The first image includes the environment light and the infrared polarized light from the infrared polarizing illuminating unit, and the second image includes the horizontal polarized light of the environment light passing through the vertical polarizing filter.

The apparatus for acquiring a differential image adjusts the brightnesses of the background images of the first image acquired in the step S120 and the second image acquired in the step S130 (S140). Particularly, in the step S140, the brightness of the background image of the first image and the brightness of the background image of the second image are adjusted to become the same as each other.

Then, the apparatus for acquiring a differential image generates the differential image between the first and second images of which the brightnesses of the background images become the same as each other in the step S140 (S150). In this case, the apparatus for acquiring a differential image may also remove the vertical polarized light component of the environment light from the differential image generated in the step S150.

The differential image generated in the step S150 is outputted to the driver monitoring system (S160) to allow the state of the driver to be monitored through the driver area of the differential image. In this case, since the driver area and the background area of the differential image are certainly discernable from each other, the driver may be more clearly recognized.

According to the exemplary embodiments of the present disclosure, the image sensor of the camera is implemented in a double structure, and light of a photographed image is adjusted using the polarizing illuminating unit and the polarizing filter, thereby making it possible to acquire two images having different brightnesses at the same point in time.

In addition, according to the exemplary embodiments of the present disclosure, after the background images of two images having different brightnesses are corrected to have the same brightness, the differential image is generated, thereby making it possible to provide the differential image in which the driver image is clearly discernable.

Although the apparatus and the method for acquiring a differential image according to the exemplary embodiment of the present disclosure have been described with reference to the accompanying drawings, the present inventive concept is not limited to the exemplary embodiment and the accompanying drawings disclosed in the present specification, but may be modified without departing from the scope and spirit of the present inventive concept.

What is claimed is:

1. An apparatus for acquiring a differential image, comprising:
a camera configured to acquire a first image and a second image at the same point in time using an image sensor, wherein the image sensor includes:
a first layer sensor for acquiring the first image including environment light and infrared polarized light from an illuminating unit;
a second layer sensor for acquiring the second image including horizontal polarized light of the environment light;
a polarizing filter, disposed between the first and second layer sensors, for blocking polarized light in the same direction as that of the infrared polarized light; and
a processor coupled to the camera and configured to:
correct brightnesses of background areas of the first and second images; and
generate a differential image between the first and second images of which the brightnesses of the background areas are corrected,
wherein the second layer sensor senses light passing through the polarizing filter to acquire the second image.

2. The apparatus according to claim 1, wherein the second layer sensor is disposed to face the first layer sensor for sensing the environment light in a direction perpendicular to a direction of the infrared polarized light in the environment light and the infrared polarized light passing through the first layer sensor.

3. The apparatus according to claim 1, wherein the image sensor synchronizes with the illuminating unit.

4. The apparatus according to claim 1, wherein the processor corrects the background areas of the first and second images so as to have the same brightness.

5. The apparatus according to claim 1, wherein the processor removes the environment light component in the differential image between the first and second images of which the brightnesses of the background areas are corrected.

6. A method for acquiring a differential image, comprising:
acquiring, by a camera, a first image including environment light and infrared polarized light from an illuminating unit and a second image including horizontal polarized light of the environment light at the same point in time using an image sensor, wherein the image sensor includes:
a first layer sensor for acquiring a first image;
a second layer sensor, disposed to face the first layer sensor, for acquiring a second image; and
a polarizing filter, disposed between the first and second layer sensors, for blocking polarized light in the same direction as that of the infrared polarized light;
correcting, by a processor, brightnesses of background areas of the first and second images; and
generating, by the processor, a differential image between the first and second images of which the brightnesses of the background areas are corrected,
wherein the second layer sensor senses light passing through the polarizing filter to acquire the second image.

7. The method according to claim 6, wherein the first image includes the environment light and the infrared polarized light, and the second image includes environment light in a direction perpendicular to a direction of the infrared polarized light in the environment light and the infrared polarized light.

8. The method according to claim 6, wherein in the step of correcting, the background areas of the first and second images are corrected so as to have the same brightness.

9. The method according to claim 6, wherein in the step of generating of the differential image, the environment light component is removed from the differential image between the first and second images of which the brightnesses of the background areas are corrected.

* * * * *